United States Patent [19]
Roth et al.

[11] Patent Number: 5,118,639
[45] Date of Patent: Jun. 2, 1992

[54] PROCESS FOR THE FORMATION OF ELEVATED SOURCE AND DRAIN STRUCTURES IN A SEMICONDUCTOR DEVICE

[75] Inventors: Scott S. Roth; Howard C. Kirsch, both of Austin, Tex.

[73] Assignee: Motorola, Inc., Schaumburg, Ill.

[21] Appl. No.: 529,299

[22] Filed: May 29, 1990

[51] Int. Cl.⁵ .......................................... H01L 21/265
[52] U.S. Cl. ........................................ 437/41; 437/40; 437/43; 437/56; 437/59; 437/192; 437/193
[58] Field of Search ................. 437/43, 41, 40, 56, 437/57, 59, 192, 193

[56] References Cited

U.S. PATENT DOCUMENTS

| | | | |
|---|---|---|---|
| 4,152,823 | 5/1979 | Hall | 437/192 |
| 4,577,392 | 3/1986 | Peterson | 29/571 |
| 4,648,175 | 3/1987 | Metz, Jr. et al. | 437/192 |
| 4,822,749 | 4/1989 | Flanner et al. | 437/193 |
| 4,937,657 | 6/1990 | Deblasi et al. | 437/192 |
| 4,948,745 | 8/1990 | Pfiester et al. | 437/41 |
| 4,965,219 | 10/1990 | Cerofolini | 437/41 |

OTHER PUBLICATIONS

Pagliaro, et al., "Uniformly Thick Selective Epitaxial Silicon," vol. 134 J. Electrochem. Soc.: Solid State Science and Technology No. 5, May 1987, pp. 1235–1238.

S. Iwamatsu, S. Meguro, and S. Shimizu; A New Isolation Structure for High Density LSI; Technical Digest; 1973 International Electron Devices Meeting, Dec. 3–5, 1973; pp. 244–247.

*Primary Examiner*—Brian E. Hearn
*Assistant Examiner*—Trung Dang
*Attorney, Agent, or Firm*—Jasper W. Dockrey

[57] ABSTRACT

A semiconductor device is disclosed having elevated source and drain regions formed by selectively depositing silicon onto a patterned layer of silicon which acts as a nucleation site for the propagation of the selective deposition process. In accordance with one embodiment of the invention, a silicon substrate is provided of a first conductivity type having an active surface area surrounded by an isolation region. A gate dielectric is formed overlying the active surface area of the substrate and a gate electrode is formed on a central portion of the active surface area. An insulation layer is formed which encapsulates the gate electrode and a first layer of silicon is deposited on the substrate. The first silicon layer is patterned to form a patterned portion overlying the active surface area and the isolation region which is spaced apart from the gate electrode by the insulation layer overlying the gate electrode. A second layer of electrically conductive material is selectively deposited using the patterned portion of the first silicon layer as a nucleation site and an impurity of a second conductivity type is introduced into the second layer of silicon. The selectively deposited layer of electrically conductive material forms elevated source and drain regions which make electrical contact with the active surface area and are electrically insulated from the gate electrode by the insulation layer encapsulating the gate electrode.

18 Claims, 2 Drawing Sheets

PROCESS FOR THE FORMATION OF ELEVATED SOURCE AND DRAIN STRUCTURES IN A SEMICONDUCTOR DEVICE

CROSS-REFERENCE TO RELATED APPLICATION

Related subject matter is disclosed in U.S. patent application Ser. No. 07/353,933 entitled "Process for Elevated Source/Drain Field Effect Structure", filed May 22, 1989 and assigned to the assignee hereof.

BACKGROUND OF THE INVENTION

This invention relates in general to a method for fabricating a semiconductor device, and more particularly to a method for forming elevated source and drain regions in an MOS transistor.

The present day semiconductor integrated circuits include many thousands of semiconductor devices interconnected on a single chip of a semiconductor material. As the complexity of the function being integrated into the circuit on the chip increases, more and more devices are crowded onto the chip. Additionally, even as the devices become more complex, the performance of the devices increase as well. In order to accommodate the higher packing density and higher performance, each individual device must be reduced in size and particular attention must be given to reducing parasitic capacitances. At the same time, it is imperative that the process used to fabricate the improved device be both manufacturable and highly reliable.

One device structure which can contribute to reducing both device size and parasitic capacitance is the elevated source/drain structure. In this structure, contact is made to the source and drain regions by a polysilicon electrode which extends from the source or drain regions themselves up onto the adjoining isolation region. The actual source or drain region can be made small and thus low in capacitance. Electrical contacts to the source and drains usually require the dedication of a relatively large area on the chip, but with the elevated source/drain structure, electrical contact is made by contacting that portion of the polysilicon electrode which is positioned on the isolation region so that the active area of the device can be minimized.

Although the elevated source/drain structure is recognized as a structure which will achieve many of the proposed size and performance goals, there has not been a reliable and manufacturable process by which such devices can be fabricated. Consequently, it would be advantageous if a process existed for the fabrication of VLSI devices capable of providing reliable elevated source and drain structures fully integral with other circuit elements and devices.

BRIEF SUMMARY OF THE INVENTION

In practicing the present invention there is provided a process for the fabrication of a semiconductor device having elevated source and drain regions including patterned extensions thereof. The elevated source and drain regions are self aligned to and spaced apart from the gate electrode by an electrical insulation layer encapsulating the gate electrode. The source and drain extensions can be patterned to form a variety of circuit elements including enlarged electrical contact pads and an electrical interconnect structure making electrical connection with adjacent transistors and peripheral devices. In accordance with one embodiment of the invention, a silicon substrate of a first conductivity type is provided having an active surface area surrounded by an isolation region. A gate dielectric is formed overlying the active surface area and a gate electrode is formed on a central portion of the active surface area. An insulation layer is formed which encapsulates the gate electrode and a first layer of silicon is deposited on the substrate. The first silicon layer is patterned to form a patterned portion overlying the active surface area and the isolation region which is spaced apart from the gate electrode by the insulation layer overlying the gate electrode. A second layer of electrically conductive material is selectively deposited using the patterned portion of the first silicon layer as a nucleation site and an impurity of a second conductivity type is introduced into the second layer of silicon. The selectively deposited layer of electrically conductive material forms elevated source and drain regions which make electrical contact with the active surface area and are electrically insulated from the gate electrode by the insulation layer encapsulating the gate electrode.

It will be appreciated that in the FIGURES the proportions of the various elements are not to scale. For example, the dimensions of some of the elements are exaggerated relative to each other for clarity.

DETAILED DESCRIPTION OF THE PREFERRED EMBODIMENTS

Various aspects of the invention will now be described in detail with reference to the Figures. FIGS. 1 through 5 illustrate process steps in accordance with the invention wherein an MOS transistor is formed having elevated source and drain regions which overlap isolation regions in the substrate. The portions of the elevated source and drain regions which overlap the isolation region can be patterned to form a variety of structural elements such as source/drain contact extensions or circuit interconnections. In one embodiment, source/drain contact extensions are provided having an enlarged area to which electrical contact can be made by an overlying lead. In another embodiment, the elevated source and drain regions are an integral part of an interconnect layer wherein electrical connection is made to adjacent transistors and peripheral electrical contact points. The MOS transistor so formed may be of either N or P-type conductivity dependent upon the dopant species used to impart enhanced electrical conductivity to the source and drain regions. For purposes of illustration, the process of the present invention is described for an N-channel, MOS transistor, however, it is to be understood that in all instances the invention is equally applicable to a P-channel device.

Figure 1:
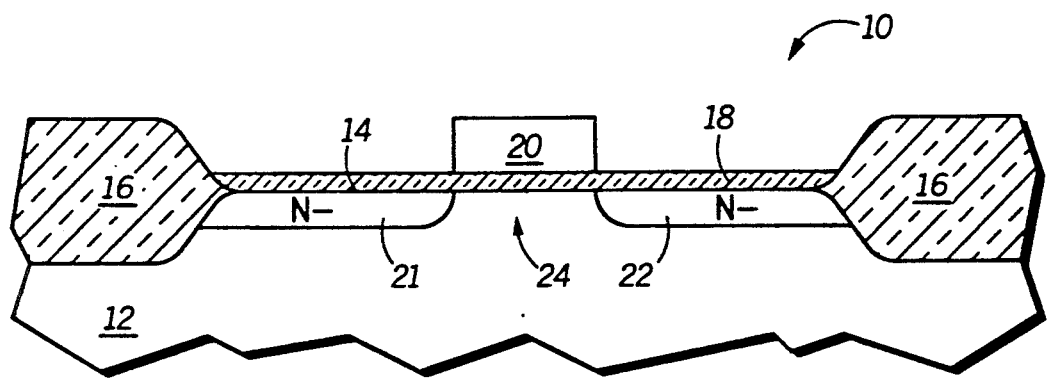
FIGS. 1-5 illustrate, in cross section, process steps in accordance with the present invention.

FIG. 1 illustrates, in cross section, a portion 10 of a semiconductor device having already undergone some of the process steps in accordance with the invention. The structure shown in FIG. 1 is preferably comprised of a monocrystalline silicon substrate 12, P-type in this example, having an active surface area 14 substantially surrounded by an isolation region 16. Isolation region 16 provides electrical isolation at the surface of substrate 12 to electrically isolate the device under construction from adjacent devices. Preferably, isolation region 16 is formed from a thick silicon oxide layer which is at least partially recessed into the surface of substrate 12. The device being fabricated is constructed on active surface area 14. A thin gate dielectric layer 18 having a thickness of about 10 to 25 nanometers is formed on active surface area 14 preferably by the thermal oxidation of substrate 12. Alternatively, other gate dielectric materials can be used to form gate dielectric layer 18 such as, a composite layer comprising at least one layer of deposited silicon nitride and at least one layer of silicon dioxide or for example, an oxynitride material and the like. A gate electrode 20 is formed in a central portion of active surface area 14 by first depositing an electrically conductive material to overlie substrate 12, then photolithographically patterning and anisotropically etching the conductive layer. Anisotropic etching is an etch process usually carried out in a reactive-ion-etch (RIE) reactor using a combination of etch gases, and reactor conditions, which result in more rapid etching of a material in the vertical direction than the horizontal direction. The directionality of the anisotropic RIE process results in the formation of structures having substantially vertical walls. Additionally, etch gases are chosen which will react with the material to be etched much more rapidly than the material present in an underlying layer. The etch rate differential between the layer to be etched and the underlying substrate is defined as the selectivity of the etch. In the present invention, the RIE process results in the selective etching of the conductive layer used to form gate electrode 20 while removing only a small portion of the underlying gate dielectric layer 18. Gate electrode 20 is preferably formed from chemical vapor deposited (CVD) polysilicon having a thickness of about 200 to 500 nanometers and doped with an N-type impurity atom. Alternatively, other conductive materials can be used such as a refractory metal, a refractory metal silicide, a composite layer comprising polysilicon, titanium nitride and a refractory metal silicide, and the like.

Following the anisotropic etching of the electrically conductive material, the active surface area is lightly doped with an N-type impurity atom, in the case of an N-channel transistor, to form a source/drain contact regions 21 and 22 which are located in substrate 12 on either side of gate electrode 20. In a preferred embodiment, source-drain contact regions 21 and 22 are formed by ion implantation of an N-type ion such as phosphorus or arsenic, using gate electrode 20 as an implantation mask. After the ion implantation step, the photoresist pattern is removed. In an alternative method, source/drain contact regions 21 and 22 can be formed by a thermal diffusion process wherein the photoresist pattern is first removed, then N-type dopant atoms are diffused into active surface area 14. The formation of source/drain contact regions 21 and 22 aligned to gate electrode 20 defines a transistor channel 24 in active surface area 14 subtending gate electrode 20. The electrical conductivity of transistor channel 24 is determined either by the initial impurity atom conductivity type and concentration in substrate 12, or alternatively, by a channel doping process performed prior to the formation of gate electrode 20 which adjusts the conductivity of active surface area 14 to a predetermined level. The lightly doped source/drain contact regions will function to lower the lateral drain electric field gradient and thereby reduce hot carrier injection into gate dielectric layer 18 during changes in voltage biasing on gate electrode 20. It should be noted that the formation of source/drain contact regions 21 and 22 is an optional step and that the degree of hot carrier protection required by a particular device will vary.

Figure 2:
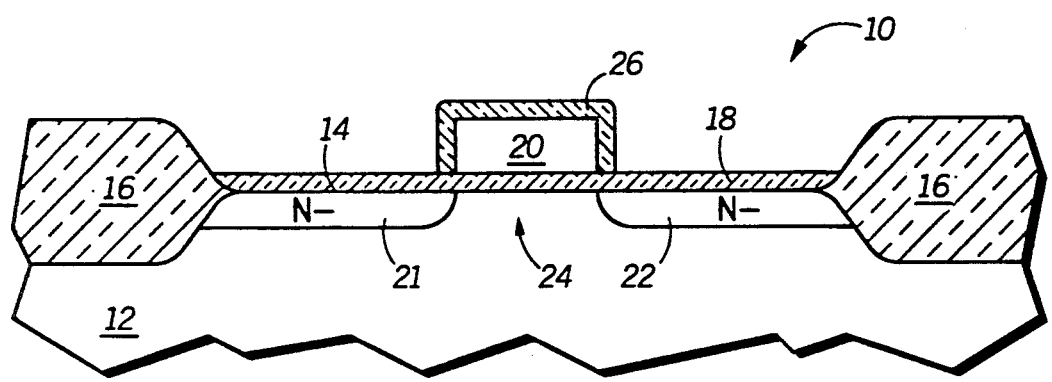

Once gate electrode 20 and source/drain contact regions 21 and 22 have been fabricated, an encapsulation layer 26 is formed overlying the top and sides of gate electrode 20, as shown in FIG. 2. Encapsulation layer 26 is preferably formed by the thermal oxidation of gate electrode 20. Alternatively, encapsulation layer 26 can be formed by a sidewall spacer process as described in commonly assigned U.S. patent application Ser. No. 353,933 which is herein incorporated by reference. The alternative encapsulation process comprises depositing a layer of gate material onto substrate 12 and subsequently depositing a layer of insulating material overlying the layer of gate material. The layer of gate material and the overlying insulating layer are patterned and anisotropically etched to form the gate electrode. Next, a layer of spacer forming material is conformably deposited to overlie the gate electrode and anisotropically etched to form sidewall spacers on the edges of the gate electrode. The gate material can be polysilicon, a refractory metal such as tungsten, titanium, platinum, cobalt and molybdenum, and silicides thereof or a composite of polysilicon and a silicide, and the like. The spacer forming material can be a low temperature oxide (LTO), silicon nitride or an oxynitride, or the like.

Figure 3:
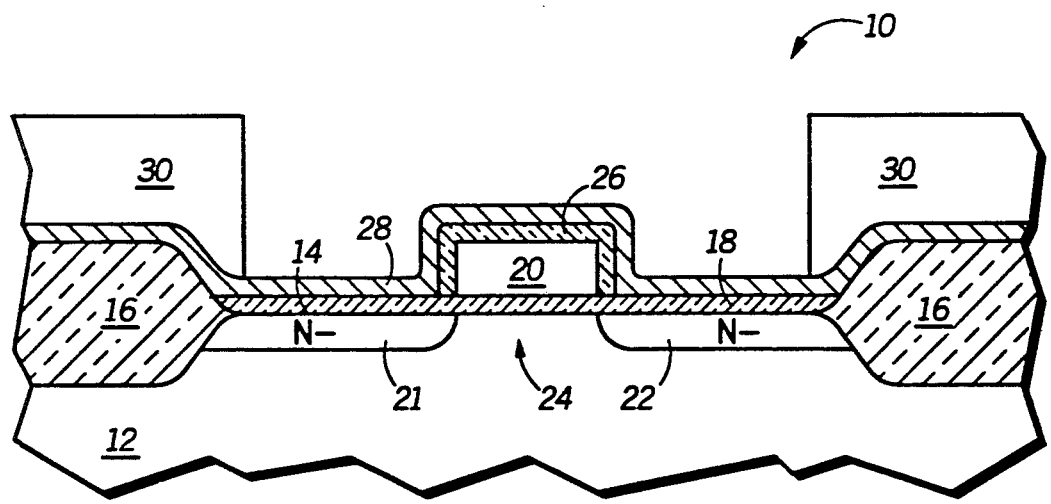

The process continues by depositing a layer of silicon onto substrate 12 to be used as a seed layer for the subsequent selective growth of silicon regions adjacent to gate electrode 20. As illustrated in FIG. 3, a seed layer 28 is deposited to continuously overlie isolation region 16, source/drain contact regions 21 and 22 and gate electrode 20. It is to be noted that seed layer 28 is separated from gate electrode 20 by encapsulation layer 26 and therefore does not directly contact any portion of gate electrode 20. In one embodiment of the invention, silicon is CVD deposited onto substrate 12 to a thickness of about 8 to 10 nanometers. Alternatively, other deposition methods may be used such as molecular beam epitaxy (MBE) and the like.

Figure 4:
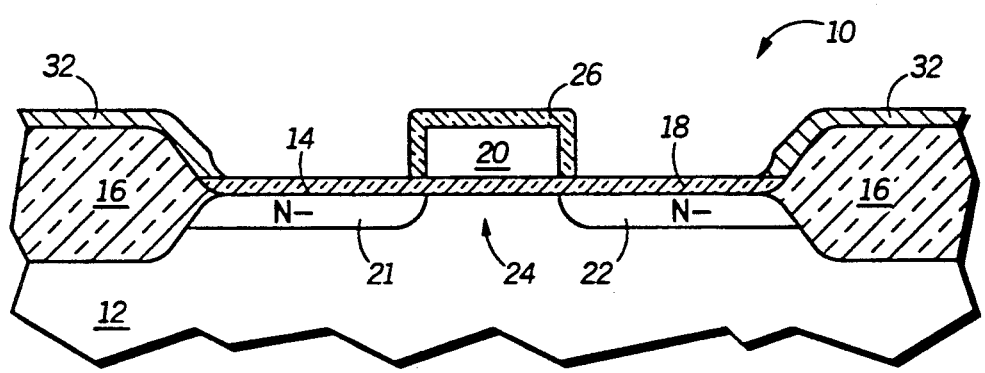

After seed layer 28 has been formed, a photoresist pattern 30 is formed to overlie substrate 12 using conventional photolithographic techniques. The configuration of the photolithographic mask used to generate photoresist pattern 30 can vary depending upon the desired outline of the source and drain extensions which will subsequently be formed overlying substrate 12. In the vicinity of gate electrode 20 photoresist pattern 30 overlies isolation region 16 and a perimeter portion of active surface area 14 while exposing gate electrode 20 and a central portion of active surface area 14. After photoresist pattern 30 has been defined on substrate 12, seed layer 28 is preferably isotropically etched to remove portions of seed layer 28 overlying gate electrode 20 and source/drain contact regions 21 and 22, and leaving a nucleation pattern 32 corresponding to the outline of photoresist pattern 30 on substrate 12. Following the isotropic etch process, photoresist pattern 30 is removed exposing nucleation pattern 32 of seed layer 28 as illustrated in FIG. 4. The isotropic etch process used to form nucleation pattern 32 is a selective, omni-directional etch process which etches in all directions at the same rate. The omni-directional etch characteristics of the isotropic etch result in the removal of all portions of seed layer 28 overlying the substantially vertical wall surface and the top surface of gate electrode 20. The isotropic etch process of the present invention is selective in that the reaction rate of the silicon comprising seed layer 28 is much higher than the reaction rate with underlying encapsulation layer 26, and gate dielectric layer 18. The etch selectivity results in the removal of only a very small portion of encapsulation layer 26 overlying gate electrode 20. In one embodiment of the invention, the isotropic etch is accomplished by means of a wet chemical etch wherein substrate 12 is exposed to an etching bath containing, for example, a solution comprised of nitric acid, hydrofluoric acid and acetic acid or water. Alternatively, an RIE etch employing for example, chlorine and halogenated gases can be used to anisotropically etch the exposed portion of seed layer 28. Additionally, a dry isotropic etch can be used employing a plasma created with, for example, a Freon-type gas and oxygen.

Following the formation of nucleation pattern 32, a portion of gate dielectric 18 overlying source/drain contact regions 21 and 22 is etched away to expose the underlying substrate surface. If gate dielectric layer 18 is silicon oxide, for example, the silicon oxide can be removed by a chemical etch comprising buffered hydrofluoric acid and water or in a dry plasma etchant which etches silicon oxide preferentially to silicon. Alternatively, if gate dielectric layer 18 is a composite dielectric comprising, for example, silicon nitride and silicon oxide, the etch can be performed in a liquid etchant such as hot phosphoric acid followed by etching in an oxide etch solution. Furthermore, a dry plasma etch can be used which selectively etches silicon nitride and silicon oxide preferentially to silicon. The etch is carried out for a sufficient amount of time to completely remove the portion of gate dielectric layer 18 overlying the substrate surface overlying source/drain contact regions 21 and 22. During the etch process a portion of encapsulation layer 26 is also removed, however, a sufficient amount of encapsulation layer 26 remains on gate electrode 20 such that gate electrode 20 remains electrically isolated and fully encapsulated by encapsulation layer 26.

Figure 5:
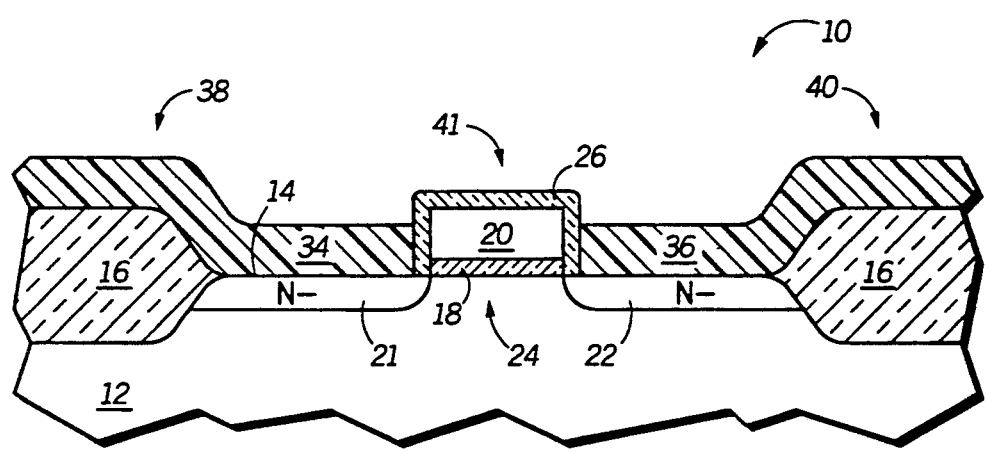

In accordance the invention, preferably polysilicon is selectively deposited on nucleation pattern 32 and on the exposed substrate surface of source/drain contact regions 21 and 22, as illustrated in FIG. 5. The selective deposition of polysilicon results in the formation of elevated source and drain regions 34 and 36 which make electrical contact with source/drain contact regions 21 and 22. In addition, the selective deposition process forms source and drain lead extensions 38 and 40 which continue outwardly from elevated source and drain regions 24 and 36 respectively over isolation region 16 and are coextensive with nucleation pattern 32. In the selective deposition process, the deposition reaction is adjusted so that the polysilicon is deposited only on exposed silicon, either polysilicon or monocrystalline silicon, which acts as a nucleation site for the deposition. The selectively deposited polysilicon deposits on both nucleation pattern 32 and on the exposed substrate surface at source/drain contact regions 21 and 22. Once the selective deposition begins on a nucleation site, the selectively deposited polysilicon itself acts as a nucleation site so that the reaction continues depositing successive layers of polysilicon eventually forming a uniformly thick layer of silicon having a thickness of about 10 to 15 nanometers. The selectively deposited polysilicon does not otherwise deposit on oxides or other dielectric material. The selectively deposited polysilicon is self-aligned to gate electrode 20 because the polysilicon only deposits on source/drain contact regions 21 and 22 and extends laterally onto isolation region 16. Elevated source and drain regions 34 and 36 are electrically insulated from gate electrode 20 by encapsulation layer 26.

The elements thus far described, and illustrated in FIG. 5, form an MOS transistor 41 comprising gate electrode 20, gate dielectric layer 18, encapsulation layer 26, source and drain contact regions 21 and 22, channel region 24 and elevated source and drain regions 34 and 36. Those skilled in the art will recognize that other materials can be used to selectively form elevated source and drain regions 34 and 36. For example, epitaxial silicon can be selectively grown using nucleation pattern 32 and the exposed substrate surface to initiate the growth of a layer of epitaxial silicon. Additionally, a refractory metal can be incorporated into the selective silicon layer via the deposition of a layer of a refractory metal such as tungsten, molybdenum, titanium, platinum, cobalt and the like onto the selective silicon layer. Following the deposition of a refractory metal layer, thermal energy is applied to selectively form a refractory metal silicide at the interface between the silicon and the refractory metal. Further, a refractory metal such as tungsten can be selectively deposited using nucleation pattern 32 as a forming substrate upon which subsequent layers of tungsten can be deposited.

Preferably the polysilicon, which is selectively deposited to form elevated source and drain regions 34 and 36, and source and drain extensions 38 and 40, is deposited as undoped polysilicon if a CMOS structure is being fabricated and is deposited N-doped in the case where an N-channel transistor is being formed. The seletively deposited polysilicon can be deposited and insitu-doped simultaneously by the introduction of a dopant gas during the selective deposition process. If deposited undoped, for either the formation of NMOS or PMOS transistors, the selectively deposited polysilicon can be subsequently doped by either ion implantation, thermal diffusion from a gaseous source or a spin-on dopant source, or the like. In the case of fabricating CMOS devices, where both N-channel and P-channel transistors are formed, the conductivity determining dopant can be applied selectively to dope selected portions of the polysilicon either N-type or P-type, as needed, by using a patterned layer of photoresist as an implantation mask.

After the doping, the application of a thermal anneal causes the diffusion of some of the conductivity determining dopant from the polysilicon into the underlying monocrystalline silicon surface of source/drain contact regions 21 and 22. The diffusion of dopants from the selectively deposited polysilicon into source/drain contact regions 21 and 22 forms an electrical contact between the elevated source and drain regions and the monocrystalline silicon substrate. Source/drain contact regions 21 and 22 remain however, lightly doped relative to the selectively deposited source and drain regions. The dopant concentration differential between the doped selectively deposited silicon and the underlying substrate preserves the hot carrier protection provided by the lightly doped substrate areas adjacent to transistor channel 24. Preferably, the selectively deposited silicon is doped to have a final sheet resistance of about 30 to 100 ohms per square.

As previously pointed out, the layout of source and drain extensions 38 and 40 on the surface of substrate 12 is determined by the particular outline of photoresist pattern 30 used to define nucleation pattern 32. In one embodiment, the patterning and etching process results in the transfer a predetermined interconnect pattern, outwardly over isolation region 16 to adjacent transistors and electrical contact pads (not shown). As determined by the patterning of seed layer 28, elevated source and drain extensions 38 and 40 then become an integral part of a patterned interconnect layer connecting other transistors and associated leads in an integrated circuit. Alternatively, source and drain extensions 38 and 40 can be configured to provide a contact pad, removed from close proximity to gate electrode 20, upon which an electrical connection can be made with an external lead, such as an overlying metal interconnect. Consequently, the application of a photolithographic process to seed layer 28 enables the selective deposition to be limited to a user defined pattern which not only creates elevated source and drain regions for a single transistor, but also can be further configured to define interconnect leads electrically connecting the transistor 41 with other circuit elements present in a complex integrated circuit.

In contrast to source/drain contact formation processes of the prior art, the present invention includes the advantage of establishing source and drain electrical contacts using a non-critical alignment of photoresist pattern 30 to active region 14. In a conventional source and drain contact formation process, electrical contacts must be made to the source and drain regions adjacent to the transistor gate through an overlying insulation layer. This procedure requires high precision alignment of the photolithographic mask to the source and drain regions on the substrate in order to avoid misaligning the contact openings to be etched in the passivation layer. Failure to properly align the source and drain contacts can result in a non-functional transistor. The present invention relieves the necessity of performing a critical photolithographic alignment by providing, in one embodiment, extended source and drain regions having a larger surface area than, for example, a conventional transistor having a similar gate length.

In addition to the above, an advantage of the present invention includes an improvement in transistor performance obtained by the increase in the cross-sectional area of the source and drain regions relative to prior art transistors having similar gate dimensions. For example, after introducing a quantity of dopant, and upon annealing, the large surface area of the elevated source and drain regions, including the lead extensions, yields a relatively low sheet resistance compared to the source and drain regions in a conventional MOS transistor. A smaller electric field gradient is thus obtained from the more gradual dopant concentration profile in the source and drain regions, which reduces the occurrence of impact ionization within the drain region during transistor switching. Additionally, the ability to form remote external electrical contacts to the source and drain regions enables the actual contact area to be larger than the available substrate surface area adjacent to the gate electrode. The increased surface area of the electrical contact between the source or drain region and an external lead produces a low contract resistance which in turn yields a high signal transmission rate.

Without further elaboration, it is believed that one skilled in the art can, using the preceding description, utilize the invention to its fullest extent. The following preferred specific embodiment is, therefore, to be construed as merely illustrative, and not limitative of the remainder of the disclosure in any way whatsoever.

EXAMPLE

Figure 6:
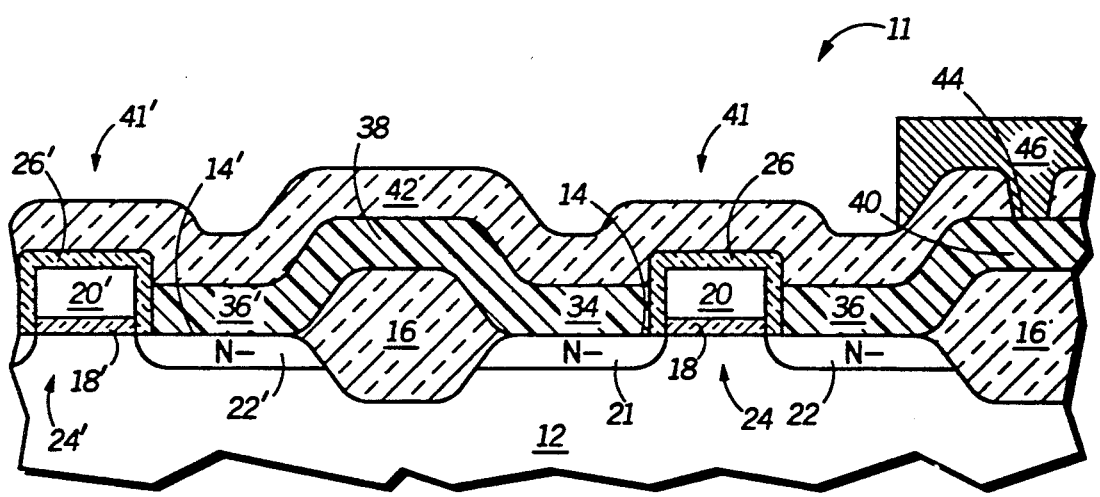
FIG. 6 illustrates, in cross section, a semiconductor device fabricated in accordance with one embodiment of the invention.

FIG. 6 illustrates, in cross section, a portion 11 of a partially completed semiconductor device fabricated in accordance with one embodiment of the invention. Portion 11 includes transistor 41 and an adjacent transistor 41' electrically isolated from transistor 41 by isolation region 16. Transistor 41' is fabricated in a manner similar to transistor 41 and is comprised of elements corresponding to those of transistor 41, which have been designated with primed element numbers. Source lead extension 38 overlies a portion of isolation region 16 located between source contact region 21 and drain contact region 22' forming an electrical connection between elevated source region 34 and elevated drain region 36'. Drain lead extension 40 overlies a portion of isolation region 16 adjacent to drain contact region 22 and extends outwardly therefrom.

A passivation layer 42 is formed to overlie transistors 41 and 41' and isolation region 16. Passivation layer 42 is preferably a doped glass layer deposited to continuously cover the surface of substrate 12. Passivation layer 42 can be comprised of silicon oxide which is optionally doped with for example, boron or phosphorus, or a combination thereof and deposited by means of chemical vapor deposition. Alternatively, passivation layer 42 can be a spin on glass dispensed onto substrate 12 while substrata 12 is rapidly rotated. After passivation layer 42 has been deposited, passivation layer 42 is patterned and etched using photolithographic techniques to form a contact opening 44 exposing a portion of drain extension 36 overlying isolation region 16, as illustrated in FIG. 6. Once contact opening 44 has been formed, an electrically conductive interconnect 46 is formed extending into contact opening 44 and making electrical contact with drain lead extension 40. Interconnect 46 can be fabricated from for example, aluminum, a refractory metal, a refractory metal silicide, aluminum alloyed with another material such as silicon, copper or a refractory metal and the like. Those skilled in the art will recognize that many other electrical contact schemes can be used to form a variety of electrical connections to and between transistors 41 and 41' as well as forming electrical connections to peripheral devices (not shown).

In a manner consistent with the level of skill in the art to which the present invention pertains, further process steps are carried out, in accordance with the present invention, to complete the fabrication of an integrated circuit device. Depending upon the particular configuration and sequence of photomasking layers, the process of the present invention can be used as an integral part of a complete process further employing additional process steps to fabricate an MOS device such as a DRAM, SRAM, data processor device, Bi-CMOS device and the like.

Thus it is apparent that there has been provided, in accordance with the invention, an MOS device having elevated source and drain regions which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional substrate regions having a specified conductivity type can be formed such as N and P-type well regions for the formation of CMOS devices and a channel stop impurity region can be formed underlying the isolation region. It is therefore intended to include within the invention all such variations and modifications as fall within the scope of the appended claims and equivalents thereof.

We claim:

1. A process for fabricating a semiconductor device comprising:

providing a substrate of a first conductivity type having an active surface area surrounded by an isolation region;

forming a gate dielectric layer to overlie the active surface area;

forming a gate electrode on a central portion of the active surface area;

forming an insulation layer encapsulating the gate electrode;

depositing a first layer of silicon to overlie the gate electrode, the active surface area and the isolation region;

patterning the first layer of silicon to form a patterned portion spaced apart from the gate electrode by the insulation layer and overlying the active surface area and the isolation region, and aligned to the active surface area; and selectively depositing a layer of electrically conductive material of silicon using the patterned portion of the first silicon layer as a nucleation site.

2. The process of claim 1 further comprising forming impurity regions of a second conductivity type in the active surface area after forming the gate insulator, the impurity regions being aligned to the edge of the transistor gate electrode.

3. The process of claim 2 wherein the impurity regions are formed by ion implantation of an impurity atom using the gate electrode as an implantation mask.

4. The process of claim 1 further comprising introducing an impurity of a second conductivity type into the layer of electrically conductive material.

5. The process of claim 4 further comprising forming impurity regions of a second conductivity type in the active surface area by diffusion of dopant atoms from the electrically conductive material into the substrate.

6. The process of claim 1 wherein the step of patterning the first layer of silicon comprises:

forming a photoresist pattern overlying the first layer of silicon which exposes a portion of the first silicon layer overlying the gate electrode and the central portion of the active surface area;

removing the exposed portion of the first silicon layer and a portion of the gate dielectric underlying the exposed portion of the first silicon layer to form a patterned portion of the first silicon layer; and removing the photoresist pattern.

7. The process of claim 1 wherein the step of forming an insulating layer encapsulating the gate electrode comprises oxidizing the gate electrode to form an oxide layer on the surface of the gate electrode.

8. The process of claim 1 wherein the step of forming an insulating layer encapsulating the gate electrode comprises:

forming a gate electrode comprising a first layer of electrically insulating material overlying a layer of electrically conductive material;

conformably depositing a second layer of electrically insulating material to overlie the gate electrode; and anisotropically etching the second layer of electrically insulating material to form sidewall spacers on the gate electrode.

9. The process of claim 1 wherein the gate electrode is comprised of a material selected from the group consisting of polysilicon, tungsten silicide, molybdenum silicide, titanium silicide, cobalt silicide and platinum silicide.

10. The process of claim 1 further comprising the steps of:

depositing a layer of refractory metal overlying the second layer of silicon; and applying thermal energy to form a refractory metal silicide.

11. The process of claim 10 wherein the refractory metal is selected from the group consisting of tungsten, molybdenum, titanium, platinum and cobalt.

12. A process for forming an MOS transistor having elevated source and drain regions comprising:

providing a substrate of a first conductivity type having an active surface area surrounded by an isolation region;

forming a gate dielectric layer to overlie the active surface area;

forming a gate electrode in a central portion of the active surface area;

forming source and drain contact regions of a second conductivity type in the active surface area which are aligned to the edges of the gate electrode;

encapsulating the gate electrode with an electrically insulating material;

depositing a first layer of silicon to overlie the gate electrode, the active surface area and the isolation region;

forming a photoresist pattern overlying the first layer of silicon which exposes a portion of the first silicon layer overlying the gate electrode and the central portion of the active surface area, the photoresist pattern aligned to the active surface area;

removing the exposed portion of the first silicon layer and a portion of the gate dielectric underlying the exposed portion of the first silicon layer to form a patterned portion of the first silicon layer;

removing the photoresist pattern; and selectively depositing a second layer of silicon using the patterned portion of the first silicon layer as a nucleation site to form elevated source and drain regions wherein the elevated source and drain regions make electrical contact with the source and drain contact regions and have lead extensions overlying the isolation region that extending outwardly therefrom.

13. The process of claim 12 further comprising doping elevated source and drain regions and the source and drain extensions with a dopant of a second conductivity type.

14. The process of claim 13 wherein the doping is carried out by ion implantation of an impurity atom.

15. The process of claim 13 wherein the doping is achieved by including a dopant gas during selective deposition.

16. The process of claim 13 wherein the source and drain contact regions are formed by thermally annealing the second layer of silicon to redistribute the dopant atoms therein and to diffuse the dopant from the second layer of silicon into the active surface area of the substrate.

17. A process for forming a semiconductor device having source and drain contacts set apart from the gate electrode comprising:

providing a substrate having an active surface area surrounded by an isolation region;

forming a gate dielectric layer to overlie the active surface area;

forming a gate electrode in a central portion of the active surface area;

depositing a first layer of silicon to overlie the gate electrode, the active surface area and the isolation region;

patterning the first layer of silicon to form a patterned portion spaced apart from the gate electrode by the insulation layer and overlying the active surface area and the isolation region, and aligned to the active surface area;

selectively depositing a second layer of silicon using the patterned portion of the first silicon layer as a nucleation site to form elevated source and drain regions overlying the active surface area and source and drain leads extending outwardly therefrom;

depositing a passivation layer overlying the second layer of silicon;

forming at least one contact opening in a portion of the passivation layer overlying a portion of the source or drain lead extensions; and filling the at least one contact opening with an electrically conductive material to form an electrical connection with the source or drain lead extensions.

18. The method of claim 17 wherein the semiconductor device is one of a DRAM, SRAM, data processor device or Bi-CMOS device.

* * * * *